US009881881B2

United States Patent
Brindle et al.

(10) Patent No.: US 9,881,881 B2
(45) Date of Patent: Jan. 30, 2018

(54) CONDUCTIVE SEAL RING FOR POWER BUS DISTRIBUTION

(71) Applicant: QUALCOMM INCORPORATED, San Diego, CA (US)

(72) Inventors: Christopher N. Brindle, Poway, CA (US); Anton Arriagada, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/809,141

(22) Filed: Jul. 24, 2015

(65) Prior Publication Data

US 2017/0025368 A1   Jan. 26, 2017

(51) Int. Cl.

| H01L 23/522 | (2006.01) |
|---|---|
| H01L 23/52 | (2006.01) |
| H01L 23/58 | (2006.01) |
| H01L 23/66 | (2006.01) |
| H01L 23/60 | (2006.01) |
| H01L 23/528 | (2006.01) |
| H01L 23/00 | (2006.01) |

(52) U.S. Cl.
CPC ........ *H01L 23/585* (2013.01); *H01L 23/5225* (2013.01); *H01L 23/5286* (2013.01); *H01L 23/60* (2013.01); *H01L 23/66* (2013.01); *H01L 23/562* (2013.01)

(58) Field of Classification Search
None
See application file for complete search history.

(56) References Cited

U.S. PATENT DOCUMENTS

| 6,044,255 | A | * | 3/2000 | Suematsu | ................ | H04B 1/28 |
|---|---|---|---|---|---|---|
| | | | | | | 330/300 |
| 6,388,498 | B1 | * | 5/2002 | Moriwaki | ............ | H01L 27/092 |
| | | | | | | 257/E27.062 |
| 6,879,023 | B1 | | 4/2005 | Gutierrez | | |
| 7,253,487 | B2 | | 8/2007 | Chen | | |
| 7,667,302 | B1 | | 2/2010 | Chang et al. | | |

(Continued)

OTHER PUBLICATIONS

International Search Report and Written Opinion—PCT/US2016/040160—ISA/EPO—dated Dec. 1, 2016.

(Continued)

*Primary Examiner* — Duy T Nguyen
*Assistant Examiner* — Bo Bin Jang
(74) *Attorney, Agent, or Firm* — Haynes & Boone, LLP

(57) ABSTRACT

A multi-block semiconductor device includes a first block and a second block operating in different power regimes from each other. A seal ring is around a periphery of the die, hermetically sealing the first and second blocks. The die has a substrate and an insulating layer, the seal ring being on the insulating layer. The seal ring serves as a power bus for the first block but not the second block. The seal ring and first block are electrically coupled to a first ground node, the first ground node being electrically isolated at a die-level from other ground nodes in the multi-block semiconductor device. In some embodiments, the second block is located in a central area of the die, and a plurality of metal lines electrically connect the seal ring to the first block, the metal lines being evenly spaced around a majority of the periphery of the semiconductor die.

13 Claims, 3 Drawing Sheets

(56) References Cited

U.S. PATENT DOCUMENTS

| | | |
|---|---|---|
| 7,898,056 B1 | 3/2011 | Keramat et al. |
| 8,310,034 B2 | 11/2012 | Uchida et al. |
| 8,395,239 B2 | 3/2013 | Chen et al. |
| 8,710,616 B2 | 4/2014 | Herberholz et al. |
| 8,933,567 B2 | 1/2015 | Bang et al. |
| 2003/0071280 A1 | 4/2003 | Yu |
| 2004/0089953 A1* | 5/2004 | McCormick ...... H01L 21/76877 257/775 |
| 2005/0186934 A1 | 8/2005 | Yajima et al. |
| 2006/0147150 A1* | 7/2006 | Epitaux ................ G02B 6/4204 385/14 |
| 2011/0241182 A1* | 10/2011 | Herberholz ........... H01L 23/564 257/629 |
| 2011/0266646 A1* | 11/2011 | Uemura ................ H01L 21/762 257/503 |

OTHER PUBLICATIONS

International Search Report and Written Opinion—PCT/US2016/040160—ISA/EPO—dated Mar. 28, 2017.

* cited by examiner

CONDUCTIVE SEAL RING FOR POWER BUS DISTRIBUTION

BACKGROUND OF THE INVENTION

Radiofrequency (RF) devices that include analog or digital blocks on the same die can suffer from cross talk between the separate blocks via a common ground connection on the die. The cross talk from RF devices can be particularly problematic for sensitive analog and digital circuits when they are located on the same die as the RF, because the RF section handles relatively high power signals with relatively high frequencies. The high frequency of the signals allows them to pass more easily through reactive parasitic paths and disrupt signals in other blocks.

Seal rings are known in the art to provide stress relief and to provide a seal to protect electrical components from environmental damage. Seal rings have also been used to address the problem of cross talk, which is a known phenomenon in integrated circuit design. For example, some seal rings in the art have been configured to be discontinuous to reduce noise coupling between digital circuits and RF circuits on an integrated circuit chip. In other examples, the seal ring is coupled to a ground potential to dissipate noise signals to ground, where the circuit components are coupled to the seal ring. Further approaches to limit the effect of cross talk include increasing the size of a layout or rearranging circuit blocks to increase the physical distance between separate blocks.

SUMMARY

A multi-block semiconductor device includes a first block and a second block operating in different power regimes from each other. A seal ring is around a periphery of the die, hermetically sealing the first and second blocks. The die has a substrate and an insulating layer, the seal ring being on the insulating layer. The seal ring serves as a power bus for the first block but not the second block. The seal ring and first block are electrically coupled to a first ground node, the first ground node being electrically isolated at a die-level from other ground nodes in the multi-block semiconductor device. In some embodiments, the second block is located in a central area of the die, and a plurality of metal lines electrically connect the seal ring to the first block, the metal lines being evenly spaced around a majority of the periphery of the semiconductor die.

DETAILED DESCRIPTION OF THE EMBODIMENTS

Figure 1A:
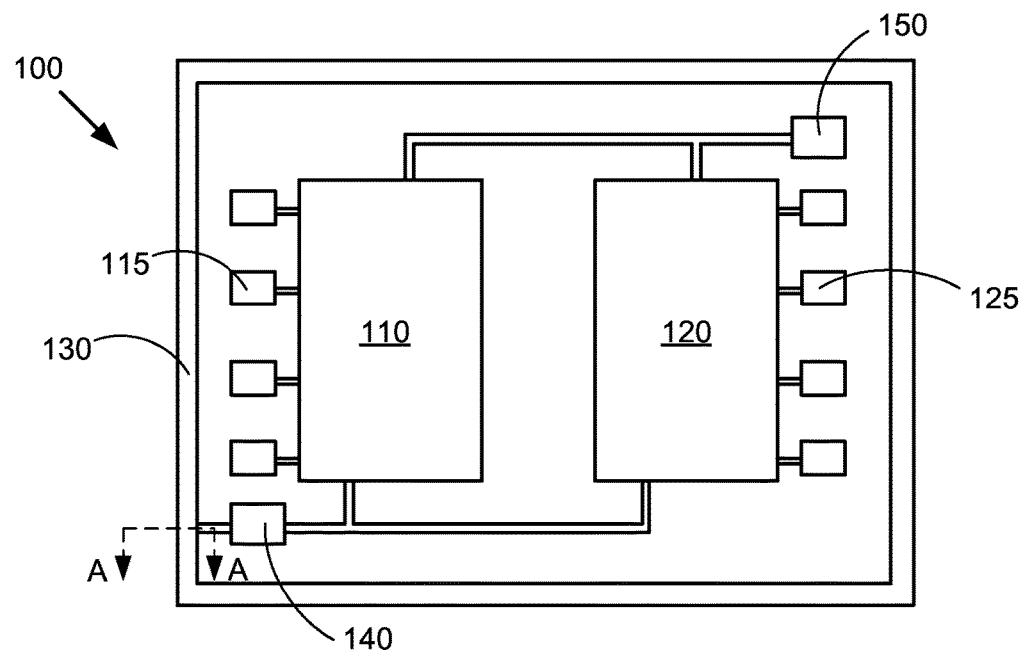
FIG. 1A is a plan view of an integrated circuit with a seal ring as known in the art.
Figure 1B:
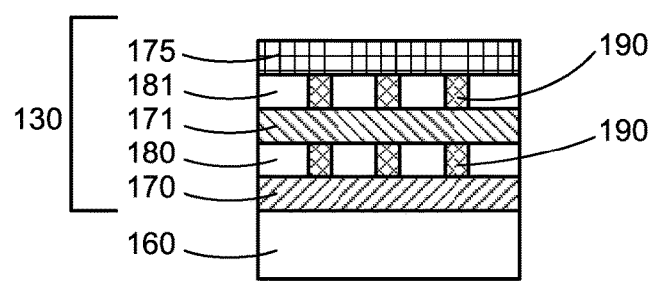
FIG. 1B is a cross-sectional view of the seal ring of FIG. 1A.

FIGS. 1A-1B show an example of a prior art integrated circuit 100 having a first circuit 110 and a second circuit 120, where, for example, first circuit 110 may be an analog circuit and second circuit 120 may be a digital circuit. The circuits 110 and 120 may also be referred to in this disclosure as blocks. FIG. 1A shows a plan view, while FIG. 1B shows a cross-sectional view of section A-A. In FIG. 1A, a seal ring 130 surrounds the periphery of the integrated circuit 100, and the circuits 110 and 120 are grounded to the seal ring 130 at a chip level through the ground connection 140. The integrated circuit 100 also includes contact metal pads 115 to enable external connections to RF circuit 110, contact metal pads 125 to enable external connections to digital circuit 120, and a power supply terminal 150 for both RF circuit 110 and digital circuit 120.

FIG. 1B shows a cross-sectional view of the seal ring 130 at section A-A of FIG. 1A. Seal ring 130 is formed on a substrate 160, and includes a metal layer 170, followed by a dielectric layer 180, another metal layer 171, and another dielectric layer 181. A seal ring metal layer 175 is over dielectric layer 181, forming a top metal layer for the seal ring 130. Metal layers 170, 171 and 175 are electrically connected by vias 190 through the dielectric layers 180 and 181. Note that although only two metal layers 170 and 171 and two dielectric layers 180 and 181 are shown between substrate 160 and seal ring metal layer 175 for clarity, additional layers may be present as needed for forming the circuit layers of first circuit 110 and second circuit 120. The seal ring 130 is grounded through ground terminal 140 of integrated circuit 100. It can be grounded via the introduction of a chemical to the surface of substrate 160 below the metal layer 170, such as a metal used to form a silicide with the substrate 160. In certain approaches, metal layer 170 will be grounded to the substrate 160 through another layer of vias that pierce through a layer of passivation or dielectric formed on the surface of the substrate 160.

Figure 2A:
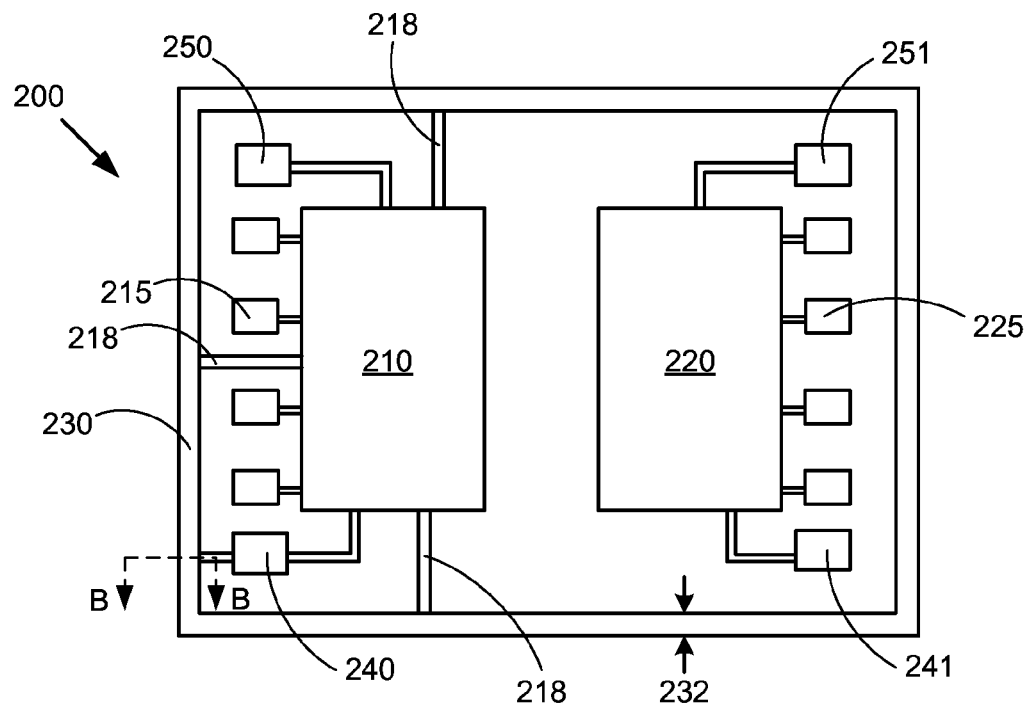
FIG. 2A shows a plan view of a multi-block die with a seal ring, in one embodiment.

FIG. 2A shows a plan view of a multi-block semiconductor device in an embodiment of the present disclosure. An integrated circuit 200 has two blocks, which shall be described as an RF circuit 210 and a digital circuit 220 in this embodiment. In other embodiments, one block could be operating in an RF regime and multiple other blocks could be analog and/or digital circuitry associated with that RF circuitry. In more general terms, the multi-block semiconductor device 200 has a first block 210 and a second block 220 operating in different power regimes from each other. In FIG. 2A, integrated circuit 200 also includes a seal ring 230, ground terminals 240 and 241, power supply terminals 250 and 251, contact metal pads 215 and 225, and metal lines 218. Power supply terminal 250 provides the power for RF circuit 210, and contact metal pads 215 enable external connections to RF circuit 210. Power supply terminal 251 provides the power for digital circuit 220, and contact metal pads 225 enable external connections to digital circuit 220.

The blocks 210 and 220 operate in different power regimes, and each have their own ground nodes. Ground terminal 240 serves as the ground node for RF circuit 210, and ground terminal 241 serves as the ground node for digital circuit 220. Seal ring 230 extends around the periphery of integrated circuit 200, providing a hermetic seal and environmental protection for the device, and also serving as a crack-stop to prevent cracks from spreading through the die and damaging the device. Thus, seal ring 230 hermetically seals the first block 210 and the second block 220. By using the same structure for two purposes, space on the die is saved. Seal ring 230 connects to ground node 240 of RF circuit block 210 in multi-block die 200. The seal ring 230 also serves as a power bus for the RF circuit 210, through metal lines 218 that connect block 210 to the seal ring 230.

Digital circuit 220, and any other blocks other than RF circuit 210 in the multi-block die 200, are not electrically connected to the seal ring 230. Thus, the seal ring 230 serves as a power bus for the first block 210 but not for the second block 220. Also, digital circuit 220 is grounded to ground node 241, which is not grounded to seal ring 230. In other words, the blocks within multi-block die 200 do not share a common ground at the chip level. The seal ring 230 and the first block 210 are electrically coupled to first ground node 240, the first ground node 240 being electrically isolated at a die-level from other ground nodes (e.g., ground node 241) in the multi-block semiconductor device 200. However, the blocks within multi-block semiconductor device 200 will generally share a common ground at the module level. Thus, RF circuit 210 has a separate ground from other blocks on the same die, and noise coupling is reduced.

Figure 2B:
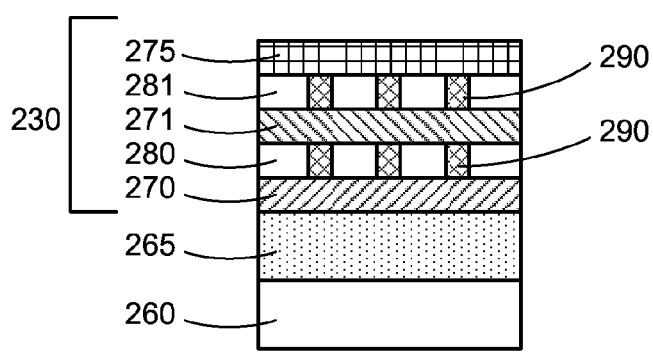
FIG. 2B is a cross-sectional view of the seal ring of FIG. 2A.

FIG. 2B shows a cross-sectional view of the seal ring 230 at section B-B of FIG. 2A. The semiconductor die includes a substrate 260 and an insulating layer 265, where insulating layer 265 may be a dielectric such as BPSG, TEOS, or FOX. The seal ring 230 may include a stack of one or more metal layers. For example, in this embodiment the seal ring 230 includes a metal layer 270 on insulating layer 265, followed by a dielectric layer 280, another metal layer 271, and another dielectric layer 281. A seal ring metal layer 275 is over dielectric layer 281, forming a top metal layer for the seal ring 230. The seal ring 230 may also include one or more vias between the metal layers. For example, in FIG. 2B, metal layers 270, 271 and 275 are electrically connected by vias 290 through the dielectric layers 280 and 281. Note that although only two metal layers 270 and 271 and two dielectric layers 280 and 281 are shown between insulating layer 265 and seal ring metal layer 275 for clarity, additional layers may be present as needed for forming the circuit layers of RF circuit 210 and digital circuit 220. For example, the seal ring 230 can be a stack of all the metal layers and vias in the process used to form the die 200. The seal ring stack could also include a layer of silicon nitride over top metal layer 275 to create a smooth seal for the device. In some embodiments, the silicon nitride could be replaced with any other passivation layer.

The seal ring 230 is grounded through ground terminal 240 of integrated circuit 200 and through the metal layers 270, 271, and 275 as those layers can generally be provided to contact external terminals such as ground node 240. Since the seal ring 230 is separated from substrate 260 by insulating layer 265, transmission of noise from RF circuit 210 through substrate 260 is reduced.

The seal ring 230 can also be used to route electrostatic discharge (ESD) currents. The seal ring may be configured to provide electrostatic discharge protection to the first block by providing a path around the chip for ESD currents to flow from one die pin to another. One potential drawback to using separate grounds, such as ground terminals 240 and 241, is that before the die is placed in a module, the device might be more sensitive to ESD events. However, after the die is placed in a module, the seal ring 230 can be used to provide ESD protection.

As mentioned above, the seal ring 230 also serves as a power bus for the block 210, through metal lines 218. In the embodiment of FIG. 2A, the metal lines 218 are spaced around the portion of the die 200 that encompasses RF circuit 210. In other embodiments, where RF circuit 210 may be configured to span a larger area of the die 200, the metal lines 218 may be spaced around the larger span of the RF circuit 210 to improve power distribution. The cross-sectional width 232 of seal ring 230 can be wider than conventional seal rings known in the art, to increase the conductivity of the seal ring and thereby improve its ability to serve as a power bus. The increased width 232 of the seal ring 230 does not limit its ability to serve as the basis for a hermetic seal, and improves its ability to serve as a crack-stop. The required width 232 for seal ring 230 to serve as a power bus depends on the application. For high frequency, high power applications, such as when the seal ring 230 serves as a power bus for an RF block, the seal ring "bus" can have a width 232 of, for example, 10 microns or wider, such as 16 microns or more, or any width that provides sufficiently low inductance so as not to cause significant radio frequency voltage potential difference between seal ring contact points.

Figure 3:
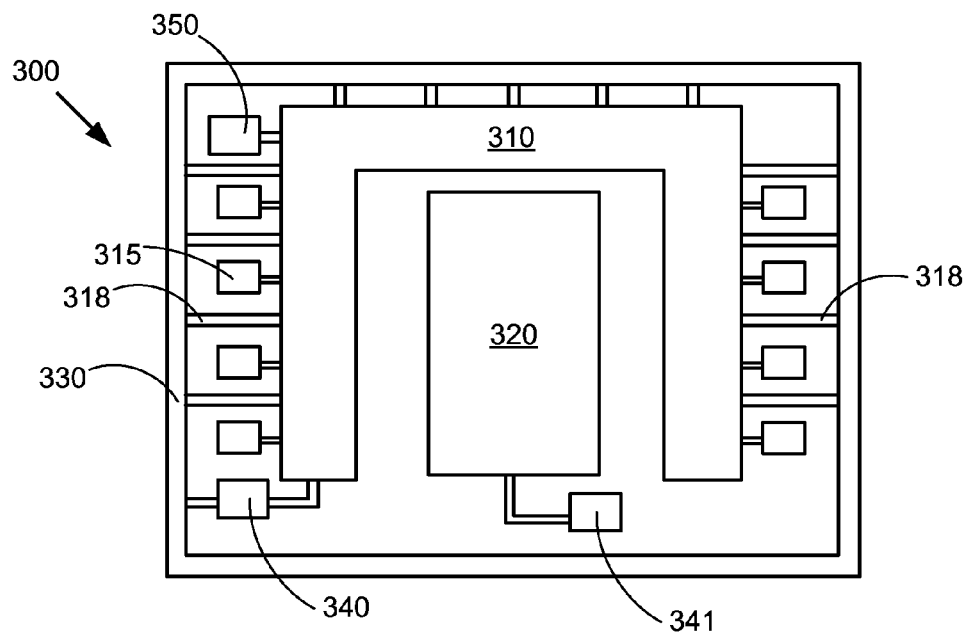
FIG. 3 shows a plan view of a multi-block die with a seal ring, in another embodiment.

FIG. 3 shows another embodiment of a semiconductor die 300 having a first circuit 310 and a second circuit 320, where second circuit 320 is centrally located. Die 300 includes a substrate and an insulating layer as described for layers 260 and 265 in FIG. 2B above. First circuit 310 may be an RF circuit, while second circuit 320 may be, for example, an analog or digital circuit. Second circuit 320 is located approximately in a central area of the die, while RF circuit 310 is located around at least a portion of the perimeter of second circuit 320. In more general terms, the semiconductor device 300 has a first block 310 and a second block 320, the first block 310 and the second block 320 operating in different power regimes from each other. In the embodiment of FIG. 3, the second block 320 is located in a central area of the die 300. The first block 310 at least partially surrounds the second block 320 in this embodiment, such that the first block 310 spans at least two sides of the second block 320. In FIG. 3, first circuit 310 forms a U-shape around three edges of second circuit 320. In other embodiments, a centrally-located second circuit may have a first circuit that spans two consecutive edges, or two opposing edges, or surrounds the entire perimeter of the second circuit.

Seal ring 330 is located around a periphery of the die 300, and hermetically seals the first block 310 and the second block 320. The seal ring 330 is on the insulating layer of the die 300, as described above in relation to FIG. 2B. Die 300 also includes a power supply terminal 350 that supplies power to RF circuit 310. RF circuit 310 is grounded through ground node 340, while second circuit 320 has a separate ground node 341. The seal ring 330 and the first block 310 are electrically coupled to first ground node 340, the first ground node 340 being electrically isolated at a die-level from other ground nodes (e.g., ground node 341) in the multi-block semiconductor device 300. In some embodiments, the first ground node 340 and the other ground nodes in the multi-block semiconductor device 300 share a common ground at a module level.

In the embodiment of FIG. 3, seal ring 330 electrically connects to the RF circuit 310 through metal lines 318 that are evenly spaced around a majority of the periphery of the semiconductor die. Thus, seal ring 330 serves as a power bus for the first block 310 but not for the second block 320. Also shown in this embodiment are metal contact pads 315 around the periphery of the semiconductor die 300, where the metal lines 318 are interspersed between the contact metal pads 315. This approach of interdigitating the seal ring's contact metal lines 318 with the RF contact pads 315 makes for a more compact layout, and also helps in evenly distributing the power to RF circuit 310.

Figure 4:
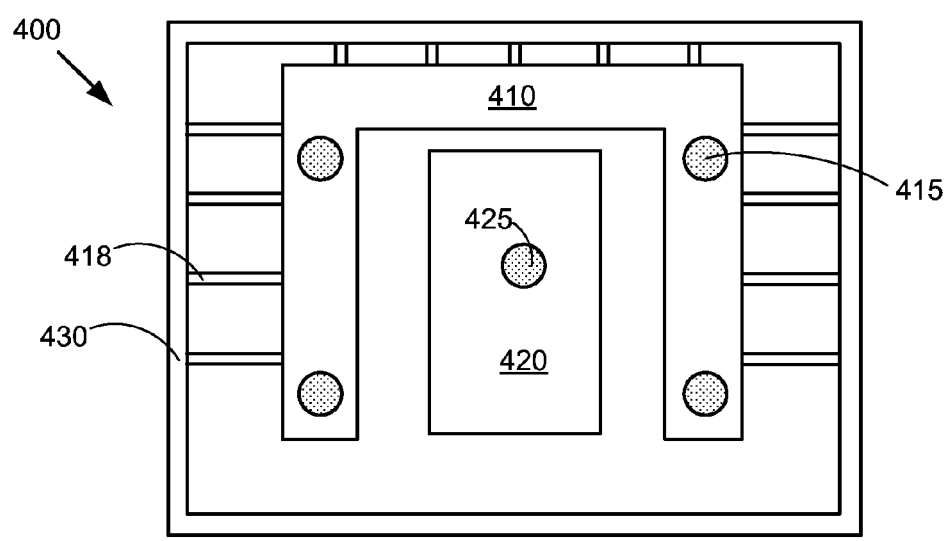
FIG. 4 is a plan view of a multi-block die with a seal ring, in a further embodiment in which the semiconductor die is packaged in a flip chip package.

FIG. 4 shows yet another embodiment using a flip chip package approach. In FIG. 4, an integrated circuit 400 has an RF circuit 410 located at least partially around a second circuit 420 similar the embodiment of FIG. 3, where second circuit 420 is located approximately in the center of the die. Second circuit 420 may be, for example, an analog or digital circuit. The second circuit 420 can be connected to flip-chip bump contact metal 425 located directly over the second circuit 420. RF circuit 410 can likewise be connected to flip-chip bump contact metal 415 directly over the RF circuit 410. A plurality of metal lines 418 are spaced around the periphery of RF circuit 410, which connect RF circuit 410 to seal ring 430. Thus, seal ring 430 serves as a power bus for RF circuit 410 but not for second circuit 420.

In further embodiments, the analog and digital circuitry may be located elsewhere on the die, such as not in the middle of the die, but within the die seal ring and not connected to the seal ring. In such embodiments, the RF circuit would still connect to the die seal ring such that the seal ring serves as a power bus for the RF block but not the other blocks.

The seal ring embodiments of the present disclosure can be used for any design that incorporates more than one desired power regime on a single chip. However, it will provide the most benefit when very high isolation is desired between separate grounds in those different regimes. Any design using a transformer or balun on a die would fall under this definition. For a specific example, wall wart transformer devices or wall wart AC to DC converters would benefit from this invention.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. A multi-block semiconductor device, comprising:
    a semiconductor die having a first block and a second block, the first block and the second block operating in different power regimes from each other, wherein the die comprises:
        a substrate; and
        an insulating layer;
    a seal ring on the insulating layer, the seal ring being around a periphery of the die and hermetically sealing the first block and the second block, wherein the seal ring serves as a power bus for the first block but not for the second block; and
    a module into which the semiconductor die is placed, further wherein the first block and the second block share a common ground at a level of the module;
    wherein the seal ring and the first block are electrically coupled to a first ground node, the first ground node being electrically isolated at a die-level from other ground nodes in the multi-block semiconductor device;
    further wherein the second block is located in a central area of the die and the first block at least partially surrounds the second block by forming a U-shape around the second block, and wherein the first block is disposed between the seal ring and at least two sides of the second block.

2. The device of claim 1, wherein the seal ring comprises a stack of a plurality of metal layers.

3. The device of claim 2, wherein the seal ring comprises a via between at least two of the metal layers.

4. The device of claim 1, wherein the seal ring has a cross-sectional width of 10 microns or more.

5. The device of claim 1, wherein the seal ring is configured to provide electrostatic discharge protection to the first block.

6. The device of claim 1, wherein the first block comprises a radio frequency circuit.

7. The device of claim 1, further comprising metal contact pads around the periphery of the semiconductor die, wherein a plurality of metal lines are interspersed between the metal contact pads.

8. The device of claim 1, wherein the semiconductor die is packaged in a flip chip package.

9. The device of claim 1, wherein the seal ring comprises a stack of a plurality of metal layers and a layer of silicon nitride over a topmost one of the metal layers.

10. A multi-block semiconductor device, comprising:
    a semiconductor die having a first block and a second block, the first block and the second block operating in different power regimes from each other, the second block being located in a central area of the die, wherein the die comprises:
        a substrate; and
        an insulating layer;
    a seal ring around a periphery of the die and hermetically sealing the first block and the second block, the seal ring being on the insulating layer, wherein the seal ring serves as a power bus for the first block but not for the second block;
    a module into which the semiconductor die is placed, further wherein the first block and the second block share a common ground at a level of the module; and
    a plurality of metal lines electrically connecting the seal ring to the first block, the plurality of metal lines being evenly spaced around a majority of the periphery of the semiconductor die;
    wherein the seal ring and the first block are electrically coupled to a first ground node, the first ground node being electrically isolated at a die-level from other ground nodes in the multi-block semiconductor device;
    further wherein the first block at least partially surrounds the second block by forming a U-shape around the second block, and wherein the first block is disposed between the seal ring and at least two sides of the second block.

11. The device of claim 10, wherein the first block comprises a radio frequency circuit.

12. The device of claim 10, wherein the semiconductor die is packaged in a flip chip package.

13. The device of claim 10, wherein the seal ring comprises a stack of a plurality of metal layers and a layer of silicon nitride over a topmost one of the metal layers.

* * * * *